United States Patent
Parthasarathy et al.

(10) Patent No.: US 8,977,808 B2
(45) Date of Patent: *Mar. 10, 2015

(54) MAPPING BETWEEN PROGRAM STATES AND DATA PATTERNS

(71) Applicant: Micron Technology, Inc., Boise, ID (US)

(72) Inventors: Sivagnanam Parthasarathy, Carlsbad, CA (US); Patrick R. Khayat, San Diego, CA (US); Mustafa N. Kaynak, San Diego, CA (US); Zhenlei Shen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.
This patent is subject to a terminal disclaimer.

(21) Appl. No.: 14/304,420

(22) Filed: Jun. 13, 2014

(65) Prior Publication Data
US 2014/0351491 A1   Nov. 27, 2014

Related U.S. Application Data

(63) Continuation of application No. 13/444,314, filed on Apr. 11, 2012, now Pat. No. 8,788,743.

(51) Int. Cl.
| | |
|---|---|
| *G06F 12/06* | (2006.01) |
| *G11C 16/00* | (2006.01) |
| *G11C 16/10* | (2006.01) |
| *G11C 14/00* | (2006.01) |
| *G06F 12/02* | (2006.01) |
| *G11C 16/04* | (2006.01) |
| *G11C 13/00* | (2006.01) |
| *G11C 11/56* | (2006.01) |

(52) U.S. Cl.
CPC ........ *G11C 14/0018* (2013.01); *G06F 12/0246* (2013.01); *G11C 16/0483* (2013.01); *G11C 14/0045* (2013.01); *G11C 13/0002* (2013.01); *G06F 2206/1014* (2013.01); *G11C 11/5628* (2013.01)
USPC .......................................... 711/103; 711/160

(58) Field of Classification Search
USPC ...................... 711/103, 170; 365/168, 185.03
See application file for complete search history.

(56) References Cited

U.S. PATENT DOCUMENTS

| | | | |
|---|---|---|---|
| 6,587,372 | B2 | 7/2003 | Blodgett |
| 7,071,849 | B2 | 7/2006 | Zhang |
| 7,167,109 | B2 | 1/2007 | Hu et al. |
| 7,848,142 | B2 | 12/2010 | Radke |
| 8,031,529 | B2 | 10/2011 | Sarin |
| 2008/0151621 | A1 | 6/2008 | Kong et al. |
| 2009/0109747 | A1 | 4/2009 | Radke |
| 2010/0110788 | A1 | 5/2010 | Bauer |
| 2010/0157641 | A1 | 6/2010 | Shalvi et al. |
| 2011/0002165 | A1 | 1/2011 | Fukuda |
| 2011/0058424 | A1 | 3/2011 | Goda et al. |
| 2011/0302475 | A1 | 12/2011 | Eisenhuth et al. |

OTHER PUBLICATIONS

International Search Report and Written Opinion for related PCT Application No. PCT/US2013/036125, mailed Jul. 31, 2013 (10 pages).

*Primary Examiner* — John Lane
(74) *Attorney, Agent, or Firm* — Brooks, Cameron & Huebsch, PLLC (57) ABSTRACT

The present disclosure includes methods and apparatuses for mapping between program states and data patterns. One method includes: programming a group of G memory cells such that a combination of respective program states of the group maps to a constellation point corresponding to a received N unit data pattern, the group used to store N/G units of data per memory cell; wherein the constellation point is one of a number of constellation points of a constellation associated with mapping respective program state combinations of the group of memory cells to N unit data patterns; and wherein the constellation comprises a first mapping shell and a second mapping shell, the constellation points corresponding to the respective first and second mapping shells determined, at least partially, based on a polynomial expression of order equal to G.

20 Claims, 7 Drawing Sheets

1.5 BITS/CELL

| CELL1 STATES — 452 | | | | |
|---|---|---|---|---|
| L2 | 6 | 7 | X | |
| L1 | 2 | 3 | 5 | |
| L0 | 0 | 1 | 4 | |
| | L0 | L1 | L2 | CELL0 STATES — 451 |

BIT[2] = 0
(BINARY VALUE OF DATA PATTERN < 4)

| BIT[2:0] | | | PGM STATES OF CELLS [1:0] | |
|---|---|---|---|---|
| [2] | [1] | [0] | CELL 1 | CELL 0 |
| 0 | 0 | 0 | L0 | L0 |
| 0 | 0 | 1 | L0 | L1 |
| 0 | 1 | 0 | L1 | L0 |
| 0 | 1 | 1 | L1 | L1 |

BIT[2] = 1
(BINARY VALUE OF DATA PATTERN ≥ 4)

| BIT[2:0] | | | PGM STATES OF CELLS [1:0] | |
|---|---|---|---|---|
| [2] | [1] | [0] | CELL 1 | CELL 0 |
| 1 | 0 | 0 | L0 | L2 |
| 1 | 0 | 1 | L1 | L2 |
| 1 | 1 | 0 | L2 | L0 |
| 1 | 1 | 1 | L2 | L1 |

*Fig. 4C*

2.25 BITS / CELL
BIT[8] = 0
(BINARY VALUE OF DATA PATTERN < 256)

560-1 →

| BITS[7:0] | [7:6] | [5:4] | [3:2] | [1:0] |
|---|---|---|---|---|
| CELLS[3:0] | CELL 3 | CELL 2 | CELL 1 | CELL 0 |

BIT[8] = 1
(BINARY VALUE OF DATA PATTERN ≥ 256)

| SWAP CELL | | | | |
|---|---|---|---|---|
| BITS[7:6] | CELL 3 | CELL 2 | CELL 1 | CELL 0 |
| 0 0 | BIT[1:0] | BIT[5:4] | BIT[3:2] | L4 |
| 0 1 | BIT[3:2] | BIT[5:4] | L4 | BIT[1:0] |
| 1 0 | BIT[5:4] | L4 | BIT[3:2] | BIT[1:0] |
| 1 1 | L4 | BIT[5:4] | BIT[3:2] | BIT[1:0] |

*Fig. 5B*

660-1 ⭢ 2.5 BITS / CELL
BIT[4] = 0  (< 16)

| BITS[3:0] | [3:2] | [1:0] |
|---|---|---|
| CELLS[1:0] | CELL 1 | CELL 0 |

*Fig. 6A*

660-2 ⭢
BIT[4] = 1  (≥ 16)

| SWAP CELL | SWAP STATE | | |
|---|---|---|---|
| BIT[3] | BIT[2] | CELL 1 | CELL 0 |
| 0 | 0 | BIT[1:0] | L4 |
| 0 | 1 | BIT[1:0] | L5 |
| 1 | 0 | L4 | BIT[1:0] |
| 1 | 1 | L5 | BIT[1:0] |

| BITS [23:0] | BIT[23:21] | BIT[20:18] | BIT[17:15] | BIT[14:12] | BIT[11:9] | BIT[8:6] | BIT[5:3] | BIT[2:0] |
|---|---|---|---|---|---|---|---|---|
| CELLS [7:0] | CELL 7 | CELL 6 | CELL 5 | CELL 4 | CELL 3 | CELL 2 | CELL 1 | CELL 0 |

| BITS[23:21] | CELLS | | | | | | | |
|---|---|---|---|---|---|---|---|---|
| | 7 | 6 | 5 | 4 | 3 | 2 | 1 | 0 |
| 0 0 0 | BIT[2:0] | BIT[20:18] | BIT[17:15] | BIT[14:12] | BIT[11:9] | BIT[8:6] | BIT[5:3] | L8 |
| 0 0 1 | BIT[5:3] | BIT[20:18] | BIT[17:15] | BIT[14:12] | BIT[11:9] | BIT[8:6] | L8 | BIT[2:0] |
| 0 1 0 | BIT[5:3] | BIT[20:18] | BIT[17:15] | BIT[14:12] | BIT[11:9] | L8 | BIT[5:3] | SYM[2:0] |
| 0 1 1 | BIT[5:3] | BIT[20:18] | BIT[17:15] | BIT[14:12] | L8 | BIT[8:6] | BIT[5:3] | SYM[2:0] |
| 1 0 0 | BIT[5:3] | BIT[20:18] | BIT[17:15] | L8 | BIT[11:9] | BIT[8:6] | BIT[5:3] | SYM[2:0] |
| 1 0 1 | BIT[5:3] | BIT[20:18] | L8 | BIT[14:12] | BIT[11:9] | BIT[8:6] | BIT[5:3] | SYM[2:0] |
| 1 1 0 | BIT[5:3] | L8 | BIT[17:15] | BIT[14:12] | BIT[11:9] | BIT[8:6] | BIT[5:3] | SYM[2:0] |
| 1 1 1 | L8 | BIT[20:18] | BIT[17:15] | BIT[14:12] | BIT[11:9] | BIT[8:6] | BIT[5:3] | SYM[2:0] |

*Fig. 7B*

MAPPING BETWEEN PROGRAM STATES AND DATA PATTERNS

PRIORITY INFORMATION

This application is a Continuation of U.S. application Ser. No. 13/444,314, filed Apr. 11, 2012, the specification of which is incorporated herein by reference.

TECHNICAL FIELD

The present disclosure relates generally to semiconductor memory and methods, and more particularly, to mapping between program states and data patterns.

BACKGROUND

Memory devices are typically provided as internal, semiconductor, integrated circuits in computers or other electronic devices. There are many different types of memory including volatile and non-volatile memory. Volatile memory can require power to maintain its data (e.g., information) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, static random access memory (SRAM), resistance variable memory, such as phase change random access memory (PCRAM) and resistive random access memory (RRAM), and magnetic random access memory (MRAM), such as spin torque transfer random access memory (STT RAM), among others.

Memory devices can be combined together to form a solid state drive (SSD). A solid state drive can include non-volatile memory such as NAND flash memory and/or NOR flash memory, and/or can include volatile memory such as DRAM, among various other types of non-volatile and volatile memory. Flash memory devices, including floating gate flash devices and charge trap flash (CTF) devices can comprise memory cells having a storage node (e.g., a floating gate or a charge trapping structure) used to store charge and may be utilized as non-volatile memory for a wide range of electronic applications.

Memory cells can be arranged in an array architecture and can be programmed to a desired state. For instance, electric charge can be placed on or removed from the storage node (e.g., floating gate) of a memory cell to place the cell into one of a number of program states. As an example, a single level cell (SLC) can be programmed to one of two program states which can represent a stored data unit (e.g., binary units 1 or 0). Various flash memory cells can be programmed to more than two program states, which can represent multiple stored data units (e.g., binary units 1111, 0111, 0011, 1011, 1001, 0001, 0101, 1101, 1100, 0100, 0000, 1000, 1010, 0010, 0110, or 1110). Such memory cells may be referred to as multi state cells, multiunit cells, or multilevel cells (MLCs). MLCs can allow the manufacture of higher density memories without increasing the number of memory cells since each cell can represent more than one digit (e.g., more than one bit).

Some MLCs can be programmed to a quantity (L) of program states that does not correspond to an integer number of stored data units. That is, the number of data units capable of being stored in a cell ($Log_2(L)$) can correspond to a fractional number of stored data units (e.g., a fractional number of bits).

DETAILED DESCRIPTION

The present disclosure includes methods and apparatuses for mapping between program states and data patterns. One method includes: programming a group of G memory cells such that a combination of respective program states of the group maps to a constellation point corresponding to a received N unit data pattern, the group used to store N/G units of data per memory cell; wherein the constellation point is one of a number of constellation points of a constellation associated with mapping respective program state combinations of the group of memory cells to N unit data patterns; and wherein the constellation comprises a first mapping shell and a second mapping shell, the constellation points corresponding to the respective first and second mapping shells determined, at least partially, based on a polynomial expression of order equal to G.

Embodiments of the present disclosure can provide a substantially systematic mapping (e.g., assignment) of program states to data patterns, and vice versa, in association with fractional unit per cell (fractional bit per cell) configurations, for instance. Embodiments can limit error multiplication and/or propagation that can negatively affect error detection and/or correction systems (e.g., systems employing error correcting codes (ECC) such as low density parity check (LDPC) codes and Hamming codes, among others), as compared to previous fractional bit per cell mapping algorithms. Embodiments can also provide benefits such as providing effective fractional bit per cell mapping without adding redundancy and without employing code expansion as in a number of previous approaches (e.g., base conversion mapping which can generate extra parities), among various other benefits.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "M", "N", "n", "A", "B", "G", and "L," particularly with respect to reference numerals in the drawings, indicates that a number of the particular feature so designated can be included with a number of embodiments of the present disclosure. As used herein, "a number of" something can refer to one or more of such things.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 500 in FIG. 5. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

Figure 1:
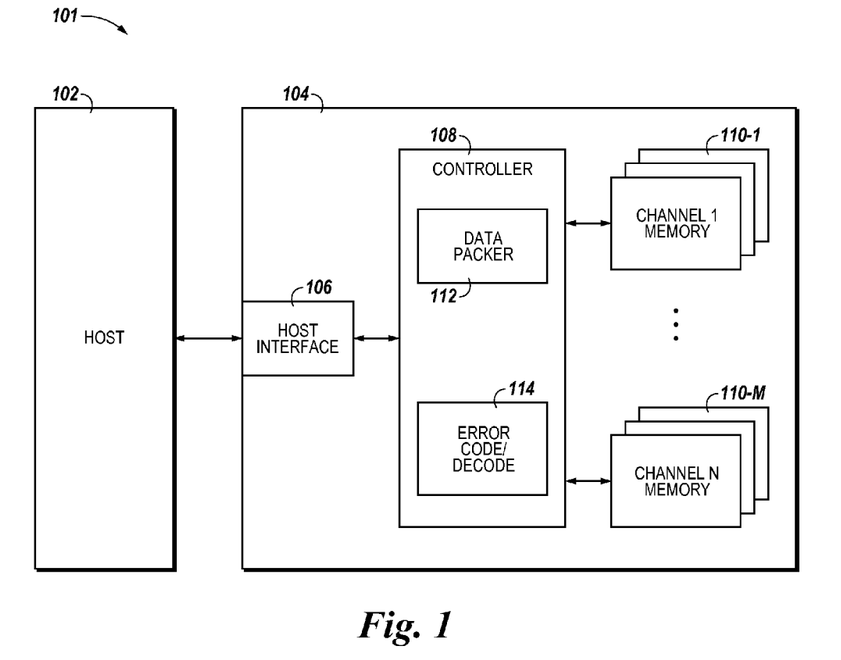
FIG. 1 is a block diagram of an apparatus in the form of a computing system including at least one memory system in accordance a number of embodiments of the present disclosure.

FIG. 1 is a block diagram of an apparatus in the form of a computing system 101 including at least one memory system 104 in accordance a number of embodiments of the present disclosure. As used herein, a memory system 104, a controller 108, or a memory device 110 might also be separately considered an "apparatus". The memory system 104 can be a solid state drive (SSD), for instance, and can include a host interface 106, a controller 108 (e.g., a processor and/or other control circuitry), and a number of memory devices 110-1, ..., 110-M (e.g., solid state memory devices such as NAND flash devices), which provide a storage volume for the memory system 104. In a number of embodiments, the controller 108, a memory device 110-1 to 110-M, and/or the host interface 106 can be physically located on a single die or within a single package (e.g., a managed NAND application). Also, in a number of embodiments, a memory (e.g., memory devices 110-1 to 110-M) can include a single memory device.

As illustrated in FIG. 1, the controller 108 can be coupled to the host interface 106 and to the memory devices 110-1, ..., 110-M via a plurality of channels and can be used to transfer data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors).

The controller 108 can communicate with the memory devices 110-1, ..., 110-M to control data read, write, and erase operations, among other operations. The controller 108 can include, for example, a number of components in the form of hardware and/or firmware (e.g., one or more integrated circuits) and/or software for controlling access to the number of memory devices 110-1, ..., 110-M and/or for facilitating data transfer between the host 102 and memory devices 110-1, ..., 110-M. For instance, in the example illustrated in FIG. 1, the controller 108 includes a data packer/unpacker component 112 and an error code/decode component 114. However, the controller 108 can include various other components not illustrated so as not to obscure embodiments of the present disclosure. Also, the components 112 and/or 114 may not be components of controller 108, in some embodiments (e.g., the components 112 and/or 114 can be independent components).

The data packer/unpacker component 112 can be used in association with mapping between memory cell program states and data in accordance with a number of embodiments described herein. The error code/decode component 114 can be an LDPC encoder/decoder, for instance, which can encode/decode user data transferred between host 102 and the memory devices 110-1, ..., 110-M.

The memory devices 110-1, ..., 110-M can include a number of arrays of memory cells. The arrays can be flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In embodiments in which the memory devices 110-1, ..., 110-M comprise flash arrays having a NAND architecture, the arrays can comprise access lines, e.g., word lines and intersecting data lines, e.g., bit lines. The arrays can comprise "strings" of memory cells connected in series source to drain between a source select gate configured to selectively couple a respective string to a common source and a drain select gate configured to selectively couple a respective string to a respective bit line. The memory cells can comprise, for instance, a source, a drain, a charge storage node (e.g., a floating gate), and a control gate, with the control gates of cells corresponding to a "row" of cells being commonly coupled to a word line. A NOR flash array would be similarly structured with the exception of strings of memory cells being coupled in parallel between select gates.

As one of ordinary skill in the art will appreciate, groups of flash cells coupled to a selected word line can be programmed and/or read together as a page of memory cells. A programming operation (e.g., a write operation), can include applying a number of program pulses (e.g., 16V-20V) to a selected word line in order to increase the threshold voltage (Vt) of selected cells coupled to that selected word line to a desired Vt level corresponding to a target (e.g., desired) program state. A read operation can include sensing a voltage and/or current change of a bit line coupled to a selected cell (e.g., responsive to a read voltage applied to the word line corresponding to the cell) in order to determine the program state of the selected cell.

As described further herein, in a number of embodiments of the present disclosure, a memory cell can be programmed to one of a quantity of program states corresponding to either an integer number of stored data units (e.g., bits) or a fractional number of stored data units. In a number of embodiments, the program states of a number of cells of a group of cells each storing a fractional number of bits can be combined such that the group of cells stores an integer number of bits. For instance, consider a group of cells each programmed to one of five program states, such that each cell can store 2.25 bits. In this example, the combined program states of a group of four cells corresponds to 9 bits (2.25 bits/cell×4 cells). That is, a 9 bit data pattern can be stored in the group of four cells. As such, controller 108 can control programming and/or reading a group of cells each storing a fractional number of bits per cell and can output (e.g., to host 102) an N unit data pattern stored in the group, where N is an integer number data units (e.g., bits). The particular data pattern (e.g., bit pattern) to which the combination of determined program states of the group corresponds can be determined based on a mapping algorithm in accordance with a number of embodiments described herein.

Figure 2:
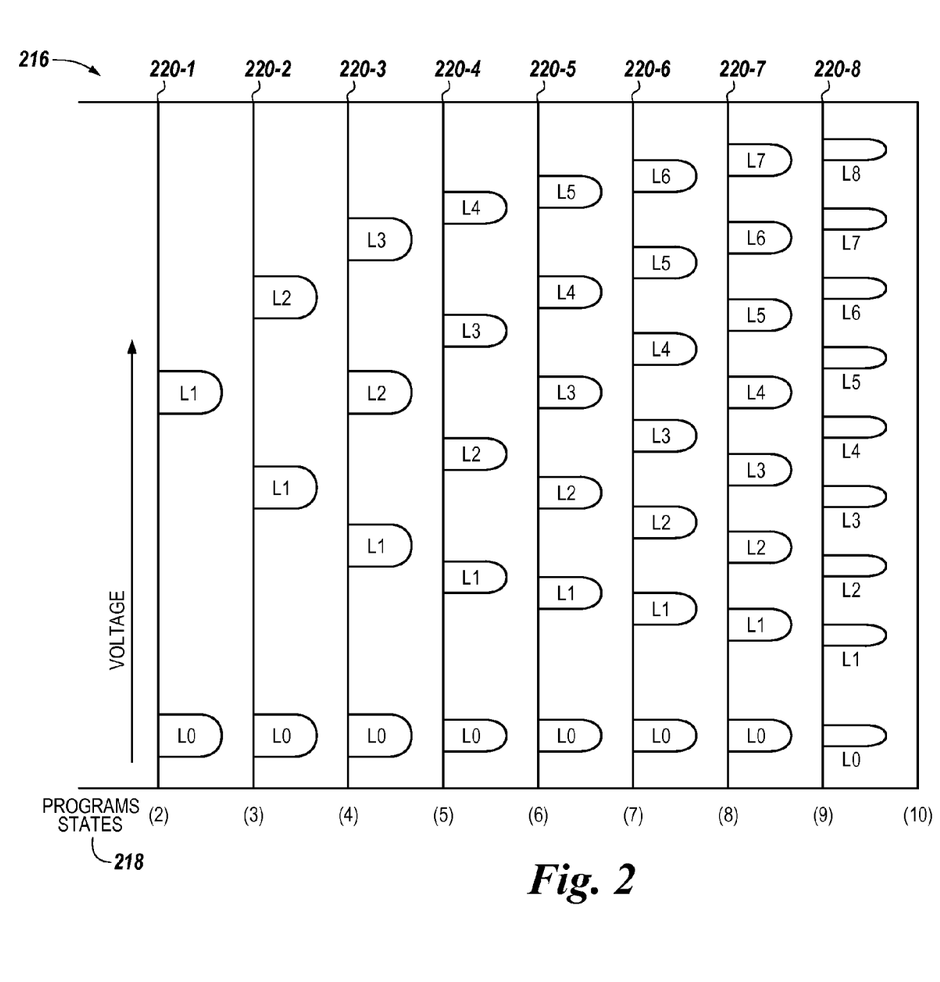
FIG. 2 is a diagram illustrating threshold voltages corresponding to program states of memory cells programmable to different numbers of program states in accordance with a number of embodiments of the present disclosure.

FIG. 2 is a diagram 216 illustrating threshold voltages corresponding to program states of memory cells programmable to different numbers of program states in accordance with a number of embodiments of the present disclosure. The memory cells can be NAND flash memory cells as described above and can be programmed to various Vt levels within a voltage range of about −2V to +3V; however, embodiments are not limited to a particular type of memory cell or to a particular operational voltage range.

Row 218 indicates the quantity of program states to which the memory cell may be programmed. The program states shown in FIG. 2 are labeled L0, L1, L2, etc., with each program state representing a distribution of Vt levels corresponding to the respective program states. In a number of embodiments, the program state L0 can be a lowermost program state (e.g., a program state corresponding to lowermost Vt levels) and may be referred to as an erase state since cells can be in a lowermost state after an erase operation; however, embodiments are not so limited.

In FIG. 2, column 220-1 corresponds to memory cells programmed to one of two different program states L0 and L1, and which can store one unit (e.g., bit) of data per cell. Column 220-2 corresponds to memory cells programmed to one of three different program states L0, L1, and L2, and which can store 1.5 units of data per cell. Column 220-3 corresponds to memory cells programmed to one of four different program states L0, L1, L2, and L3, and which can store 2 units of data per cell. Column 220-4 corresponds to memory cells programmed to one of five different program states L0 to L4, and which can store 2.25 units of data per cell. Column 220-5 corresponds to memory cells programmed to one of six different program states L0 to L5, and which can store 2.5 units of data per cell. Column 220-6 corresponds to memory cells programmed to one of seven different program states L0 to L6, and which can store 2.75 units of data per cell. Column 220-7 corresponds to memory cells programmed to one of eight different program states L0 to L7, and which can store 3 units of data per cell. Column 220-8 corresponds to memory cells programmed to one of nine different program states L0 to L8, and which can store 3.125 units of data per cell.

Memory cells programmable to a power of 2 quantity of program states (e.g., 2 program states, 4 program states, 8, program states, 16 program states, etc.) can individually store an integer number of bits per cell (e.g., $\log_2(L)$ bits/cell where L is the number of program states to which the cell is programmable). As such, the program state of each memory cell can be directly mapped to one of L different N bit data patterns where N is the integer quantity of bits stored in the cell. For instance, the program states of a cell programmable to two program states (L0 and L1) can be mapped to 0 or 1 (e.g., a 1 bit data pattern), the program states of a cell programmable to 4 program states (L0 to L3) can be mapped to 00, 01, 10, and 11, respectively (e.g., a 2 bit data pattern), and the program states of a cell programmable to 8 program states (L0 to L7) can be mapped to 000, 001, 010, 011, 100, 101, 110, and 111, respectively (e.g., a 3 bit data pattern).

In contrast, memory cells programmable to a non-power of 2 quantity of program states individually store a fractional (e.g., non-integer) number of bits per cell. As such, rather than program states of each individual cell mapping to an N bit data pattern, combinations of the L program states to which each individual cell of a group of cells is programmable are mapped to an N bit data pattern where N is an integer quantity of bits stored in the group. For instance, combinations of respective program states of a group of two memory cells programmable to three program states (L0, L1, and L2) (e.g., 1.5 bits/cell) are mapped to a 3 bit (e.g., 1.5 bits/cell×2 cells) data pattern (e.g., 000, 110, 100, etc.). Similarly, combinations of respective program states of a group of four memory cells programmable to five program states (L0 to L4) (e.g., 2.25 bits/cell) are mapped to a 9 bit (e.g., 2.25 bits/cell×4 cells) data pattern (e.g., 110011001, 000001111, 101010101, etc.), and combinations of respective program states of a group of eight memory cells programmable to 9 states (L0 to L8) (e.g., 3.125 bits/cell) are mapped to a 25 bit (e.g., 3.125 bits/cell×8 cells) data pattern (e.g., 0000011111000001111100000, 1010101010101010101010101, 1111111111111111110000000, etc.).

In general, for a group of cells collectively storing an integer number (N) of units of data (e.g., bits), but individually storing a fractional number of units of data, $2^N$ different N unit data patterns are mapped to a corresponding number (e.g., $2^N$) of different program state combinations of the group. As an example, consider a group of two cells each programmed to one of three program states (L0, L1, L2) such that the group collectively stores 3 bits of data (e.g., 1.5 bits/cell). As such, $2^3$ (e.g., 8) different 3 bit data patterns are mapped to $2^3$ (e.g., 8) different program state combinations of the group.

In a number of embodiments, a constellation (e.g., an L×L square constellation where L is the quantity of program states to which a cell is programmable) can be used to represent the different possible program state combinations associated with a group of fractional unit memory cells. For instance, each possible program state combination can correspond to a different constellation point, which can be mapped to a particular N unit data pattern, where N is the integer quantity of data units stored in the group of cells. The quantity of program state combinations (e.g., the quantity of constellation points) can equal $L^2$, which must be greater than or equal to the $2^N$ different N unit data patterns corresponding to the N quantity of data units stored in the group of cells. As such, one or more of the $L^2$ program state combinations may not be mapped to an N unit data pattern, or one or more of the $L^2$ program state combinations may be mapped to a same one of the N unit data patterns as one or more others of the $L^2$ program state combinations. An example of a mapping constellation in accordance with a number of embodiments of the present disclosure is described below in connection with FIG. 4A.

The particular mappings of data patterns to respective program state combinations corresponding to groups of fractional unit (e.g., fractional bit) memory cells and vice versa can vary. That is, the manner in which program state combinations are assigned to the data patterns may not be uniform. In some previous approaches, a code expansion can be performed on a data pattern in association with mapping data patterns to particular program state combinations. However, such code expansion leads to an increase in error correction code redundancy and decreases capacity and can lead to error multiplication and/or propagation. In contrast, a number of embodiments of the present disclosure can effectively and efficiently map between data patterns and program states without performing a code expansion, for instance. As such, a number of embodiments of the present disclosure can provide decreased complexity and/or can reduce and/or prevent error multiplication and/or propagation as compared to previous approaches.

As described further below in connection with FIG. 3, a number of embodiments of the present disclosure can include receiving an N unit data pattern to be stored in (e.g., written to) a group of G memory cells such that each cell stores N/G units of data. The memory cells can be fractional unit memory cells (e.g., N/G can be a non-integer) each programmable to one of L program states. L can be a minimum quantity of program states used to store N/G units of data per cell, with a cell capable of storing $\log_2(L)$ units of data per cell. As an example, a 9 unit data pattern (e.g., N=9) can be stored in a group of 4 memory cells (e.g., G=4) such that each memory cell stores 2.25 units of data per cell (e.g., N/G=2.25). In this example, the minimum number of program states need to store 2.25 data units per cell is 5 (e.g., L=5). That is, a group of 4 memory cells each programmable to one of 5 program states can store a 9 unit data pattern. Mapping between the particular program state combinations of the group of four cells and the respective 9 unit (e.g., 9 bit) data patterns to which they correspond can be determined in accordance with a number of embodiments described herein.

In a number of embodiments, mapping between program state combinations and data patterns is based on a polynomial expression of order G, where G is a number of fractional unit cells combined to store an integer number of units of data corresponding to a data pattern. In a number of embodiments, a first term of the polynomial expression corresponds to a first mapping shell and a second term of the polynomial expression corresponds to a second mapping shell, with each mapping shell corresponding to a number of constellation points. As an example, the polynomial expression on which the mapping is based can be the expression $(A+B)^G$, with $A^G$ being the first term and corresponding to a quantity of constellation points of the first mapping shell, and $G \times A^{(G-1)} \times B$ being the second term and corresponding to a quantity of constellation points of the second mapping shell. As described further below, A can be the quantity of program states from which the respective program state combinations corresponding to the first mapping shell are determined and B can be the quantity of additional program states (e.g., an additional quantity of the L program states) from which the respective program state combinations corresponding to the second mapping shell are determined. As such, in embodiments in which two mapping shells are used, A+B is equal to the quantity of program states to which the memory cells are programmable. As an example, A can be equal to $2^a$ with "a" being a value such that $2^a$ is an uppermost power of 2 value that is less than the quantity of program states (e.g., L) to which the memory cells are programmable. For instance, for cells programmable to 6 different program states and storing 2.5 bits/cell, A is equal to 4 since $2^2$ is the closest power of 2 value that is less than 6. Since A is equal to 4, B is equal to 2 (e.g., 6–4). As such, the quantity of program states from which the respective program state combinations corresponding to the first mapping shell are determined is four. That is, only combinations of the first four program states (e.g., L0 to L3) of the six program states (e.g., L0 to L5) to which the memory cells are programmable, correspond to constellation points of the first mapping shell. In this example, the quantity of additional program states from which the respective program state combinations corresponding to the second mapping shell is two (e.g., B=2). As such, only combinations comprising at least one of the last two program states (e.g., L4 and L5) of the six program states (e.g., L0 to L5) to which the memory cells are programmable, correspond to constellation points of the second mapping shell. In a number of embodiments, the A program states corresponding to the first mapping shell comprise the lowermost A program states of the L program states (e.g., the program states corresponding to the lowermost Vt levels), and the B program states corresponding to the second mapping shell comprise program states other than the lowermost A program states.

Figure 3:
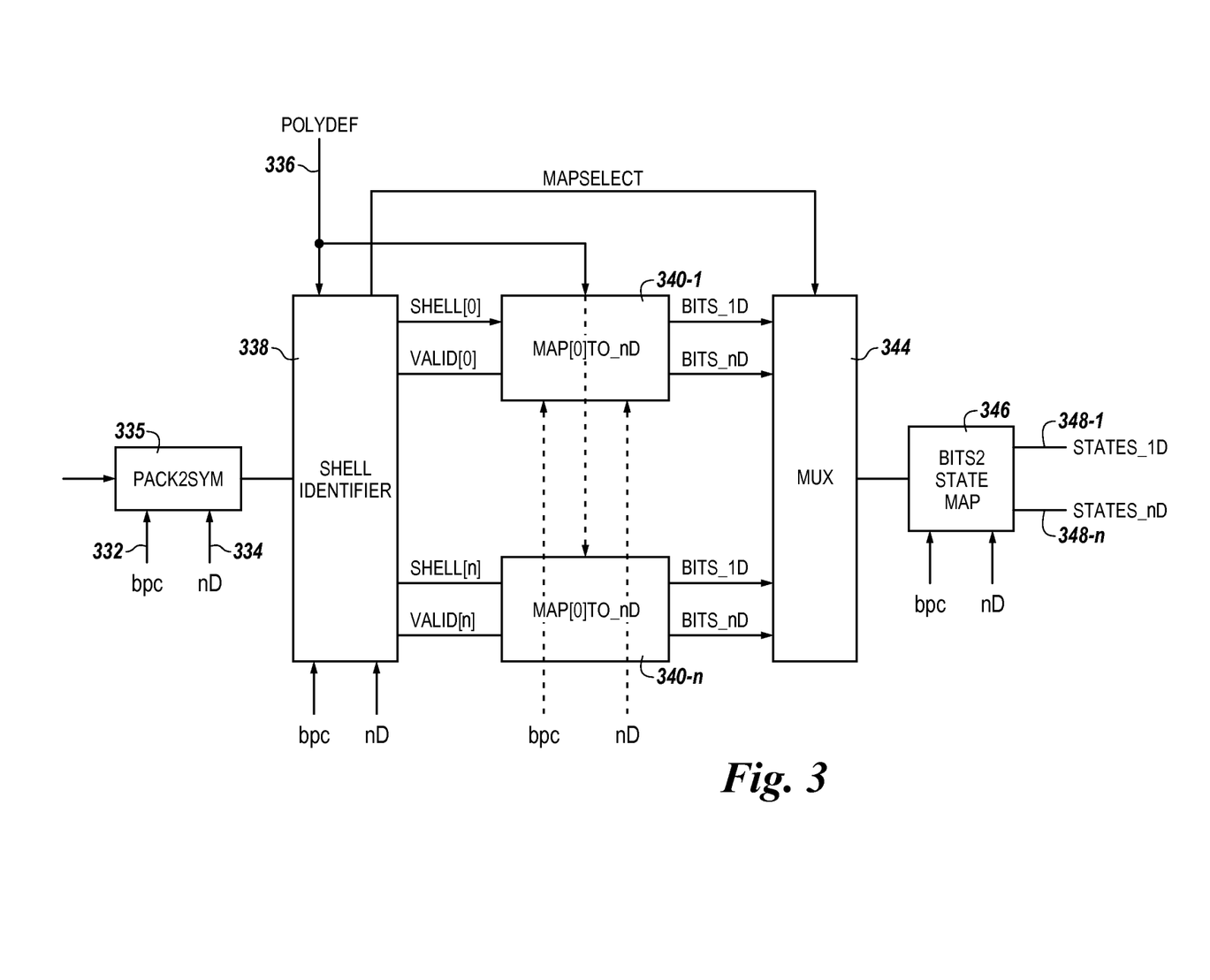
FIG. 3 is a functional block diagram of a method of mapping between data patterns and program states in accordance with a number of embodiments of the present disclosure.

FIG. 3 is a functional block diagram of a method of mapping between data patterns and program states in accordance with a number of embodiments of the present disclosure. The method illustrated in FIG. 3 can be implemented via a data packing component such as data packer/unpacker 112 shown in FIG. 1. At 335 of FIG. 3, a symbol size (e.g., an N bit symbol) can be formed. The symbol size can correspond, for instance, to a quantity of bits stored per cell 332 (shown as "bpc") multiplied by a minimum quantity of cells (shown as "nD") 334 needed to store an integer number of bits. For instance, if a group of memory cells store 1.5 bits/cell, then the minimum number of cells needed to store an integer number of bits is 2 cells, which corresponds to a symbol size of 3 bits (e.g., 1.5 bits/cell×2 cells). A symbol size of N bits indicates that $2^N$ different N bit data patterns are to be mapped (e.g., assigned) to $2^N$ respective program state combinations (e.g., $2^N$ constellation points) corresponding to the quantity of cells 334.

At 338 of FIG. 3, a polynomial expression (e.g., $(A+B)^G$ as described above) can be used to determine the quantity of mapping shells needed for mapping data patterns of the determined symbol size to the $2^N$ respective program state combinations, as well as to determine to which of the number of mapping shells a particular N bit data pattern corresponds. When a data pattern corresponds to the first mapping shell (e.g., "Shell[0]"), then mapper 340-1 (shown as "Map[0] To_nD") maps the respective bits of the N bit data pattern to the cells of the group. In FIG. 3, output "Bits_1D" of mapper 340-1 corresponds to bits of the N bit data pattern assigned to a first cell of the group, and output "Bits_nD" of mapper 340-1 corresponds to bits of the N bit data pattern assigned to an nth cell of the group, where n is the quantity of cells (e.g., 1 to n) in the group. As described further below, in a number of embodiments, a MSB (most significant bit) of a data pattern (e.g., of an N bit symbol) is used to determine whether or not the data pattern maps to the first mapping shell. For example, an MSB of "0" can indicate the data pattern maps to the first mapping shell, and an MSB of "1" can indicate the data pattern maps to a higher order mapping shell. When a data pattern corresponds to an "nth" mapping shell (e.g., a $2^{nd}$ or $3^{rd}$ mapping shell, etc.), then mapper 340-n (shown as "Map[n]To_nD") maps the respective bits of the N bit data pattern to the cells of the group. In FIG. 3, output "Bits_1D" of mapper 340-n corresponds to bits of the N bit data pattern assigned to a first cell of the group, and output "Bits_nD" of mapper 340-n corresponds to bits of the N bit data pattern assigned to an nth cell of the group.

The outputs of mappers 340-1 to 340-n can be multiplexed 344 and a mapper 346 (shown as "Bits2 State Map") can map the bits assigned to the respective cells (e.g., cells 1 to nD) to respective program states. The output 348-1 (shown as "States_1D") indicates the program state to which the first cell of the group of n cells is to be programmed and the output 348-n (shown as "States_nD") indicates the program state to which the nth cell of the group is to be programmed such that the combination of the program states of cells 1 to n maps to the appropriate N-bit data pattern of the $2^N$ data patterns corresponding to the particular symbol size employed.

Figure 4A:
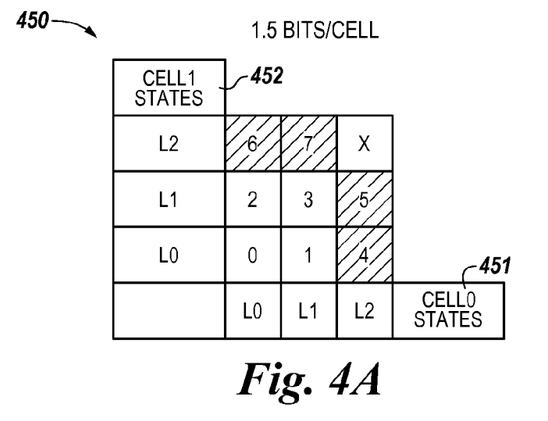
FIG. 4A illustrates a diagram including a constellation having a first and a second mapping shell and associated with mapping between data patterns and program states in accordance with a number of embodiments of the present disclosure.

As an example, the method illustrated in FIG. 3 can be used in association with determining mapping shells such as those of FIG. 4A, which illustrates a diagram 450 including a constellation having a first and a second mapping shell associated with mapping between data patterns and program states in accordance with a number of embodiments of the present disclosure. Diagram 450 represents a constellation (e.g., a square constellation) associated with a group of two cells (e.g., cell 0 and cell 1) storing 3 bits of data (e.g., 1.5 bits/cell) such that a corresponding symbol size is 3 bits, which can be represented as [2:0]. Row 451 illustrates the three program states (e.g., L0, L1, and L2) to which cell 0 (e.g., a first cell of the group) is programmable and column 452 illustrates the three program states (e.g., L0, L1, and L2) to which cell 1 (e.g., a second cell of the group) is programmable. As such, the constellation of FIG. 4A includes nine constellation points corresponding to the nine possible program state combinations (cell 0 state; cell 1 state) (e.g., (L0; L0), (L0; L1), (L0; L2), (L1; L0), (L1; L1), (L1; L2), (L2; L0), (L2; L1), and (L2; L2)).

Table 1 shown below provides configuration information associated with the example described in connection with FIGS. 4A-4C. Table 1 indicates the quantity of bits stored per cell ("bpc") (e.g., 1.5), the quantity of states ("States") to which the memory cells are programmable (e.g., 3), the quantity of cells ("Cells/nD") corresponding to an N bit data pattern (e.g., 2), N corresponding to a symbol size, the quantity of constellation points ("Constellation points") needed to map to $2^N$ program state combinations (e.g., 8), the quantity of program states used to form program state combinations corresponding to the first mapping shell ("First shell states") (e.g., 2), the quantity of constellation points of the first mapping shell ("First shell points") (e.g., 4), the quantity of additional program states used to form program state combinations corresponding to the second mapping shell ("Second shell states")(e.g., 1), the quantity of constellation points of the second mapping shell ("Second shell points") (e.g., 4), and the packing density ("Packing density") (e.g., 88.89%). The packing density is equal to $(2^{bpc \times nD})/(L^{nD})$ where bpc is the quantity of bits/cell stored in a group of quantity nD cells, with bpc×nD corresponding to an the symbol size (e.g., N bits), and L is the quantity of program states to which the group of cells are programmable.

FIG. 4A, the constellation point corresponding to the program state combination (L2; L2) is not mapped to a data pattern (e.g., as indicated by an "x" in diagram 450). As such, the packing density is less than 100%. In general, a higher packing density corresponds to a higher utilization of memory capacity (e.g., flash capacity). In a number of embodiments, those one or more program state combinations which are not mapped to a data pattern correspond to higher program state combinations (e.g., those combinations including program states corresponding to higher Vt levels), which can provide benefits such as preventing charge loss effects associated with higher program states.

The quantity of constellation points of the respective first and second mapping shells can be determined using the first two terms of the polynomial expression described above (e.g., $(A+B)^G$), with $A^G$ being the first term and indicating the quantity of constellation points of the first mapping shell and $G \times A^{(G-1)} \times B$ being the second term and corresponding to a quantity of constellation points of the second mapping shell. In the 1.5 bits/cell example of FIG. 4A, A is equal to 2, G is equal to 2, and B is equal to 1. As such, $A^G$ is equal to 4 and $G \times A^{(G-1)} \times B$ is equal to 4. As described above, A is the quantity of program states from which the respective program state combinations corresponding to the first mapping shell are determined and B is the quantity of additional program states from which the respective program state combinations corresponding to the second mapping shell are determined. As such, in this example, combinations of the first 2 program states (e.g., L0 and L1) are mapped to the respective 4 constellation points of the first mapping shell and the 4 constellation points of the second mapping shell map to program state combinations that include the uppermost program state (e.g., L2). That is, program state combinations of the second mapping shell include one cell having program state L0 or L1, and one cell having program state L2.

As shown in FIG. 4A, the 4 constellation points of the first mapping shell are numbered 0 to 3 and correspond to the respective program state combinations (L0; L0), (L0; L1), (L1; L0), and (L1; L1). The 4 constellation points of the second mapping shell are numbered 4 to 7 and correspond to the respective program state combinations (L2; L0), (L2; L1), (L0; L2), and (L1; L2). The decimal values 0 to 7 correspond to the respective 3 bit data patterns 000 to 111.

Figure 4B:
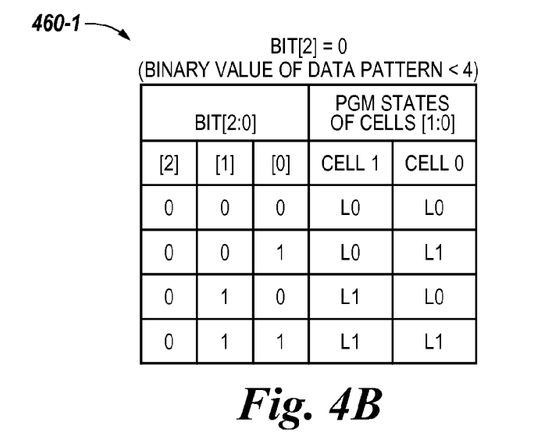
FIGS. 4B-4C illustrate mappings between data patterns and program states in accordance with a number of embodiments of the present disclosure. The example shown in FIGS. 4B-4C supports two-dimensional (2D) mapping over two cells.
Figure 4C:
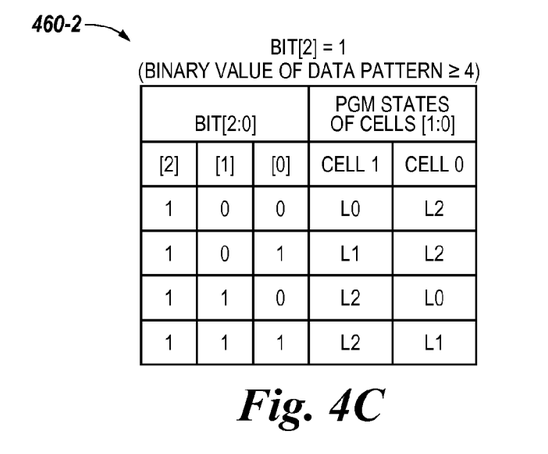

FIGS. 4B and 4C illustrate a manner in which the different 3 bit data patterns are mapped to the program state combinations corresponding to the first and second mapping shells, respectively. Diagram 460-1 illustrates mappings corresponding to the first mapping shell and diagram 460-2 illustrates mappings corresponding to the second mapping shell. In this example, the MSB (e.g., bit[2]) of the 3 bit data pattern (e.g., represented as bit[2:0]) indicates whether the data pat-

TABLE 1

| bpc | States | Cells/nD | Constellation points | First shell states | First shell points | Second shell additional states | Second shell points | Packing density |
|---|---|---|---|---|---|---|---|---|
| 1.5 | 3 | 2 | 8 | 2 | 4 | 1 | 4 | 88.89% |

Therefore, in the example shown in FIG. 4A, the quantity of constellation points, and hence the quantity of different program state combinations is 9, which is one greater than the quantity of data patterns needed to represent the 8 different N bit (e.g., 3 bit) data patterns (e.g., $2^N$). As such, as shown in tern maps to the first shell or the second shell. For instance, if bit[2] is "0" (e.g., the binary value of the 3 bit data pattern is less than 4), the data pattern maps to the first shell, and if bit[2] is "1" (e.g., the binary value of the 3 bit data pattern is greater than or equal to 4), the data pattern maps to the second shell.

The mappings of FIG. 4B corresponding to the first mapping shell are systematic (e.g., they can then be determined in a systematic manner). For instance, bit[1] can be assigned to cell[1] and bit[0] can be assigned to cell[0] (the cells represented as cells[1:0]). That is, as shown in FIG. 4B, the binary values of bits [1:0] of the data pattern [2:0] correspond directly to the program states of cells[1:0] (e.g., a binary value of "1" corresponding to program state L1 and a binary value of "0" corresponding to program state L0).

The mappings of FIG. 4C corresponding to the second mapping shell are near systematic (e.g., they can be determined in a substantially systematic manner). The mappings corresponding to the second mapping shell are not entirely systematic since, unlike the first mapping shell, the binary values of bits [1:0] of the 3 bit data pattern (e.g., symbol size) do not correspond directly to the program states of respective cells[1:0]. As noted above, for the second mapping shell, one of cells[1:0] carries program state L2. In this example, bit[1] is used to determine which of cells[1:0] carries L2 (e.g., a binary value of "0" for bit[1] indicates cell[0] carries L2 and a binary value of "1" for bit[1] indicates cell[1] carries L2. A bit(s) used to determine which cell carries the one or more of a number of program states not corresponding to a first mapping shell can be referred to herein as a "swap cell bit(s)," and the cell that carries the one or more of the number of program states not corresponding to the first mapping shell can be referred to herein as a "swap cell." In this example, bit[1] is the swap cell bit. As such, if bit[1] is "0," cell[0] is the swap cell and if bit[1] is "1," cell[1] is the swap cell. As in the first shell mapping of FIG. 4B, in FIG. 4C, the binary value of bit[0] does correspond directly with program states L0 and L1 (e.g., a value of "0" corresponds to L0 and a value of "1" corresponds to L1). However, when cell[0] is the swap cell, bit[0] is assigned to cell[1] and when cell[1] is the swap cell, bit[0] is assigned to cell[0]. As such, FIGS. 4B and 4C illustrate a manner in which the different 3 bit data patterns corresponding to a first and a second mapping shell are mapped to respective program state combinations of a group of two memory cells each storing 1.5 bits/cell in accordance with a number of embodiments of the present disclosure.

Table 2 shown below provides configuration information associated with the example described in connection with FIGS. 5A and 5B. Table 2 indicates the quantity of bits stored per cell ("bpc") (e.g., 2.25), the quantity of states ("States") to which the memory cells are programmable (e.g., 5), the quantity of cells ("Cells/nD") corresponding to an N bit data pattern (e.g., 4), N corresponding to a symbol size (e.g., 9 bits in this example), the quantity of constellation points ("Constellation points") needed to map to $2^N$ program state combinations (e.g., 512), the quantity of program states used to form program state combinations corresponding to the first mapping shell ("First shell states") (e.g., 4), the quantity of constellation points of the first mapping shell ("First shell points") (e.g., 256), the quantity of additional program states used to form program state combinations corresponding to the second mapping shell ("Second shell states")(e.g., 1), the quantity of constellation points of the second mapping shell ("Second shell points") (e.g., 256), and the packing density ("Packing density") (e.g., 81.92%).

The quantity of constellation points of the respective first and second mapping shells can be determined using the first two terms of the polynomial expression described above (e.g., $(A+B)^G$), with $A^G$ being the first term and indicating the quantity of constellation points of the first mapping shell and $G \times A^{(G-1)} \times B$ being the second term and corresponding to a quantity of constellation points of the second mapping shell. In the 2.25 bits/cell example of FIGS. 5A and 5B, A is equal to 4, G is equal to 4, and B is equal to 1. As such, $A^G$ is equal to 256 and $G \times A^{(G-1)} \times B$ is equal to 256. As described above, A is the quantity of program states from which the respective program state combinations corresponding to the first mapping shell are determined and B is the quantity of additional program states from which the respective program state combinations corresponding to the second mapping shell are determined. As such, in this example, combinations of the first 4 program states (e.g., L0 to L3) are mapped to the respective 256 constellation points of the first mapping shell and the 256 constellation points of the second mapping shell map to program state combinations that include a program state other than the first 4 program states (e.g., the uppermost program state L4). As shown in FIG. 5B, in this example, program state combinations of the second mapping shell include one cell having one of program states L0 to L3, and one cell carrying program state L4.

Figure 5A:
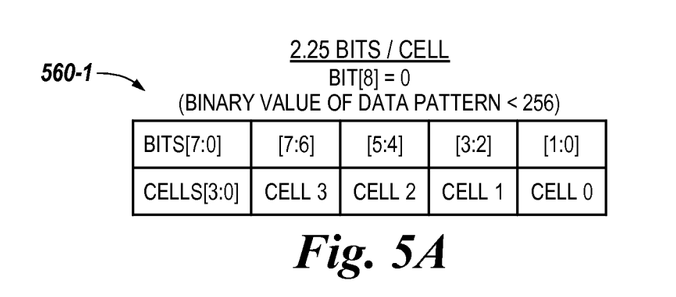
FIGS. 5A-5B illustrate mappings between data patterns and program states in accordance with a number of embodiments of the present disclosure. The example shown in FIGS. 5A-5B supports four-dimensional (4D) mapping over four cells.
Figure 5B:
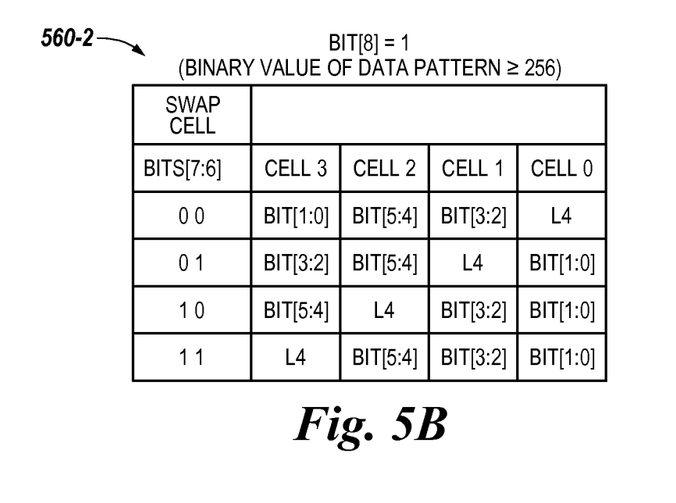

FIGS. 5A and 5B illustrate a manner in which the different 9 bit data patterns are mapped to the program state combinations corresponding to the first and second mapping shells, respectively. Diagram 560-1 illustrates mappings corresponding to the first mapping shell and diagram 560-2 illustrates mappings corresponding to the second mapping shell. In this example, the MSB (e.g., bit[8]) of the 9 bit data pattern (e.g., represented as bit[8:0]) indicates whether the data pattern maps to the first shell or the second shell. For instance, if bit[8] is "0" (e.g., the binary value of the 9 bit data pattern is less than 256), the data pattern maps to the first shell, and if bit[8] is "1" (e.g., the binary value of the 9 bit data pattern is greater than or equal to 256), the data pattern maps to the second shell.

FIG. 5A illustrates how the bits[7:0] of the 9 bit data pattern can be mapped to program state combinations of the four cells[3:0] systematically for the first mapping shell. For instance, bits [7:6] can be assigned to cell[3], bits[5:4] can be assigned to cell[2], bits[3:2] can be assigned to cell[1], and bits[1:0] can be assigned to cell[0], with the binary values of the bit pairs assigned to the cells corresponding directly to the program states of the respective cells (e.g., with the binary values "00," "01," "10," and "11," corresponding directly to L0, L1, L2, and L3, respectively).

FIG. 5B illustrates how the bits [7:0] of the 9 bit data pattern can be mapped to program state combinations of the four cells[3:0] for the second mapping shell. As noted above, for program state combinations of the second mapping shell, one of cells[3:0] carries program state L4. In this example, bits[7:6] are used to determine which of cells[3:0] carries program state L4 (e.g., a binary value of "00" for bits[7:6]

TABLE 2

| bpc | States | Cells/nD | Constellation points | First shell states | First shell points | Second shell additional states | Second shell points | Packing density |
|---|---|---|---|---|---|---|---|---|
| 2.25 | 5 | 4 | 512 | 4 | 256 | 1 | 256 | 81.92% | indicates cell[0] carries L4, a binary value of "01" for bits[7:6] indicates cell[1] carries L4, a binary value of "10" for bits [7:6] indicates cell[2] carries L4, and a binary value of "11" for bits[7:6] indicates cell[3] carries L4. That is, bits [7:6] are the swap bits for this 2.25 bits/cell example. As such, as shown in FIG. 5B, if bits[7:6] are "00," cell[0] is the swap cell, if bits[7:6] are "01," cell[1] is the swap cell, if bits[7:6] are "10," cell[2] is the swap cell, and if bits[7:6] are "11," cell[3] is the swap cell. FIG. 5B also indicates the bit assignments for the three cells that do not carry L4. For instance, as illustrated, if bits [7:6] of the 9 bit data pattern are "00" such that cell[0] carries L4, then bits [3:2] are assigned to cell[1], bits [5:4] are assigned to cell [2], and bits [0:1] are assigned to cell[3]. In the second mapping shell, the bit pairs [5:4], [3:2], and [1:0] of the 9 bit data pattern each correspond directly to the program states L0 to L3. For instance, a 9 bit data pattern of 100100111 having bits[7:6] being "00," bits[5:4] being "10," bits[3:2] being "01," and bits[1:0] being "11," maps to cell[0] being programmed to program state L4, cell[1] being programmed to program state L1, cell[2] being programmed to program state L2, and cell[3] being programmed to program state L3 in accordance with the second shell mapping illustrated in FIG. 5B. The mapping corresponding to the second shell is near systematic. For instance, two of the four cells corresponding to the mapping carry systematic information all of the time.

As such, FIGS. 5A and 5B illustrate a manner in which the different 9 bit data patterns corresponding to a first and a second mapping shell are mapped to respective program state combinations of a group of four memory cells each storing 2.25 bits/cell in accordance with a number of embodiments of the present disclosure.

Table 3 shown below provides configuration information associated with the example described in connection with FIGS. 6A and 6B. Table 3 indicates the quantity of bits stored per cell ("bpc") (e.g., 2.5), the quantity of states ("States") to which the memory cells are programmable (e.g., 6), the quantity of cells ("Cells/nD") corresponding to an N bit data pattern (e.g., 2), N corresponding to a symbol size (e.g., 5 bits in this example), the quantity of constellation points ("Constellation points") needed to map to $2^N$ program state combinations (e.g., 32), the quantity of program states used to form program state combinations corresponding to the first mapping shell ("First shell states") (e.g., 4), the quantity of constellation points of the first mapping shell ("First shell points") (e.g., 16), the quantity of additional program states used to form program state combinations corresponding to the second mapping shell ("Second shell states")(e.g., 2), the quantity of constellation points of the second mapping shell ("Second shell points") (e.g., 16), and the packing density ("Packing density") (e.g., 88.89%).

The quantity of constellation points of the respective first and second mapping shells can be determined using the first two terms of the polynomial expression described above (e.g., $(A+B)^G$), with $A^G$ being the first term and indicating the quantity of constellation points of the first mapping shell and $G \times A^{(G-1)} \times B$ being the second term and corresponding to a quantity of constellation points of the second mapping shell. In the 2.5 bits/cell example of FIGS. 6A and 6B, A is equal to 4, G is equal to 2, and B is equal to 2. As such, $A^G$ is equal to 16 and $G \times A^{(G-1)} \times B$ is equal to 16. As described above, A is the quantity of program states from which the respective program state combinations corresponding to the first mapping shell are determined and B is the quantity of additional program states from which the respective program state combinations corresponding to the second mapping shell are determined. As such, in this example, combinations of the first 4 program states (e.g., L0 to L3) are mapped to the respective 16 constellation points of the first mapping shell and the 16 constellation points of the second mapping shell map to program state combinations that include a program state other than the first 4 program states (e.g., the program states L4 and L5). As shown in FIG. 6B, in this example, program state combinations of the second mapping shell include one cell having one of program states L0 to L3, and one cell carrying program state L4 or L5.

Figure 6A:
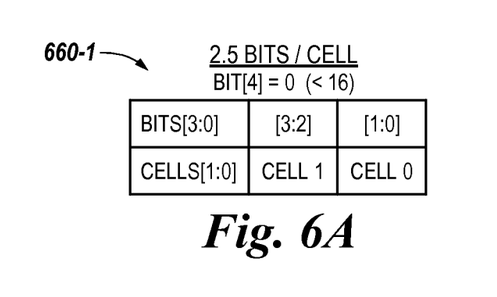
FIGS. 6A-6B illustrate mappings between data patterns and program states in accordance with a number of embodiments of the present disclosure.
Figure 6B:
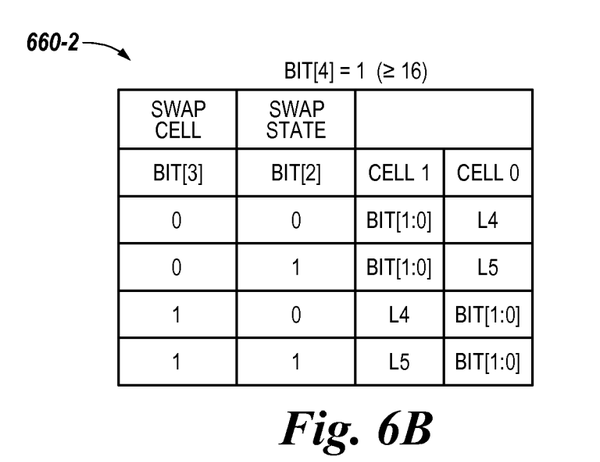

FIGS. 6A and 6B illustrate a manner in which the different 5 bit data patterns are mapped to the program state combinations corresponding to the first and second mapping shells, respectively. Diagram 660-1 illustrates mappings corresponding to the first mapping shell and diagram 660-2 illustrates mappings corresponding to the second mapping shell. In this example, the MSB (e.g., bit[4]) of the 5 bit data pattern (e.g., represented as bit[4:0]) indicates whether the data pattern maps to the first shell or the second shell. For instance, if bit[4] is "0" (e.g., the binary value of the 5 bit data pattern is less than 16), the data pattern maps to the first shell, and if bit[4] is "1" (e.g., the binary value of the 5 bit data pattern is greater than or equal to 16), the data pattern maps to the second shell.

FIG. 6A illustrates how the bits[4:0] of the 5 bit data pattern can be mapped to program state combinations of the two cells[1:0] systematically for the first mapping shell. For instance, bits [1:0] can be assigned to cell[0], and bits[3:2] can be assigned to cell[1], with the binary values of the bit pairs assigned to the cells corresponding directly to the program states of the respective cells (e.g., with the binary values "00," "01," "10," and "11," corresponding directly to L0, L1, L2, and L3, respectively).

FIG. 6B illustrates how the bits [4:0] of the 5 bit data pattern can be mapped to program state combinations of the two cells[1:0] for the second mapping shell. For program state combinations of the second mapping shell, one of cells [1:0] carries program state L4 or L5 since B is equal to 2 (e.g., 2 additional program states correspond to the second mapping shell). In this example, bit[3] is used to determine which of cells[1:0] carries program state L4 or L5 (e.g., a binary value of "0" for bit[3] indicates cell[0] carries L4 or L5, and

TABLE 3

| bpc | States | Cells/nD | Constellation points | First shell states | First shell points | Second shell additional states | Second shell points | Packing density |
|---|---|---|---|---|---|---|---|---|
| 2.5 | 6 | 2 | 32 | 4 | 16 | 2 | 16 | 88.89% | a binary value of "1" for bit[3] indicates cell[1] carries L4 or L5. That is, bit[3] is the swap bit for this 2.5 bits/cell example. As such, as shown in FIG. 6B, if bit[3] is "0," cell[0] is the swap cell, and if bit[3] is "1," cell[1] is the swap cell. In embodiments in which B corresponds to a quantity of program states greater than one, a bit(s) can also be used to determine which of the B program states is to be carried by the swap cell. The program state carried by the swap cell is referred to herein as the "swap state." In this example, bit[2] is used to determine the swap state. For instance, if bit[2] is "0," the swap state is L4, and if bit[2] is "1," then the swap state is L5, in the example shown in FIG. 6B.

FIG. 6B also indicates the bit assignments for the cell that does not carry L4 or L5. As in the first shell mapping of FIG. 6A, in FIG. 6B, the binary value of bits[1:0] does correspond directly with program states L0 to L3 (e.g., a value of "00" corresponds to L0, a value of "01" corresponds to L1, a value of "10" corresponds to L2, and a value of "11" corresponds to L3). However, when cell[0] is the swap cell, bits[1:0] are assigned to cell[1] and when cell[1] is the swap cell, bits[1:0] are assigned to cell[0]. As such, FIGS. 6A and 6B illustrate a manner in which the different 5 bit data patterns corresponding to a first and a second mapping shell are mapped to respective program state combinations of a group of two memory cells each storing 2.5 bits/cell in accordance with a number of embodiments of the present disclosure.

Table 4 shown below provides configuration information associated with the example described in connection with FIGS. 7A and 7B. Table 4 indicates the quantity of bits stored per cell ("bpc") (e.g., 3.125), the quantity of states ("States") to which the memory cells are programmable (e.g., 9), the quantity of cells ("Cells/nD") corresponding to an N bit data pattern (e.g., 8), N corresponding to a symbol size (e.g., 25 bits in this example), the quantity of constellation points ("Constellation points") needed to map to $2^N$ program state combinations (e.g., 33,554,432), the quantity of program states used to form program state combinations corresponding to the first mapping shell ("First shell states") (e.g., 8), the quantity of constellation points of the first mapping shell ("First shell points") (e.g., 16,777,216), the quantity of additional program states used to form program state combinations corresponding to the second mapping shell ("Second shell states")(e.g., 1), the quantity of constellation points of the second mapping shell ("Second shell points") (e.g., 16,777,216), and the packing density ("Packing density") (e.g., 77.95%).

TABLE 4

| | |
|---|---|
| bpc | 3.125 |
| States | 9 |
| Cells/nD | 8 |
| Constellation points | 33,554,432 |
| First shell states | 8 |
| First shell points | 16,777,216 |
| Second shell additional states | 1 |
| Second shell points | 16,777,216 |
| Packing density | 77.95% |

The quantity of constellation points of the respective first and second mapping shells can be determined using the first two terms of the polynomial expression described above (e.g., $(A+B)^G$), with $A^G$ being the first term and indicating the quantity of constellation points of the first mapping shell and $G \times A^{(G-1)} \times B$ being the second term and corresponding to a quantity of constellation points of the second mapping shell. In the 3.125 bits/cell example of FIGS. 7A and 7B, A is equal to 8, G is equal to 8, and B is equal to 1. As such, $A^G$ is equal to 16,777,216 and $G \times A^{(G-1)} \times B$ is equal to 16,777,216. As described above, A is the quantity of program states from which the respective program state combinations corresponding to the first mapping shell are determined and B is the quantity of additional program states from which the respective program state combinations corresponding to the second mapping shell are determined. As such, in this example, combinations of the first 8 program states (e.g., L0 to L7) are mapped to the respective 16,777,216 constellation points of the first mapping shell and the 16,777,216 constellation points of the second mapping shell map to program state combinations that include a program state other than the first 8 program states (e.g., the uppermost program state L8). As shown in FIG. 7B, in this example, program state combinations of the second mapping shell include one cell having one of program states L0 to L7, and one cell carrying program state L8.

Figure 7A:
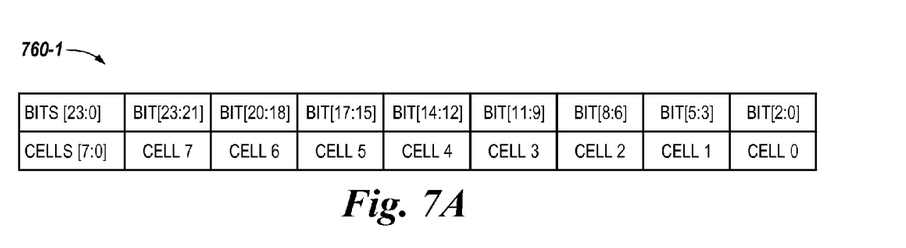
FIGS. 7A-7B illustrate mappings between data patterns and program states in accordance with a number of embodiments of the present disclosure. The example shown in FIGS. 7A-7B supports eight-dimensional (8D) mapping over eight cells.
Figure 7B:
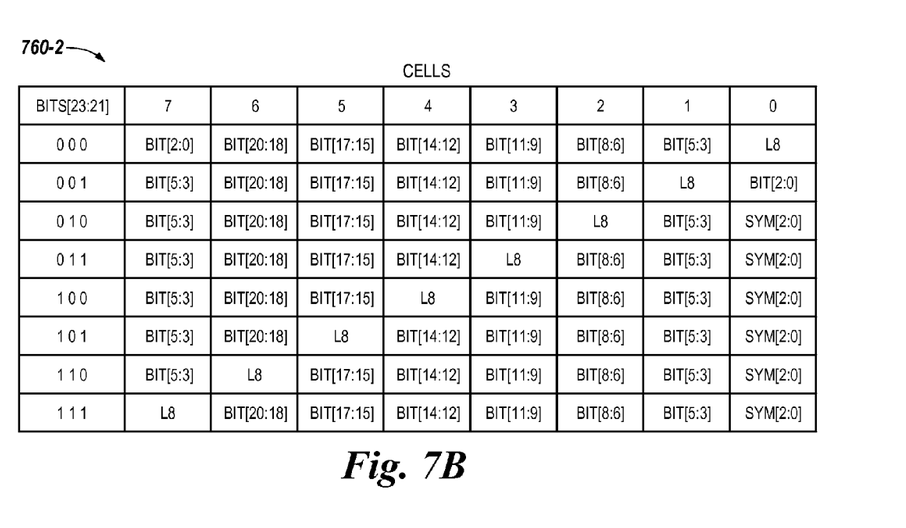

FIGS. 7A and 7B illustrate a manner in which the different 25 bit data patterns are mapped to the program state combinations corresponding to the first and second mapping shells, respectively. Diagram 760-1 illustrates mappings corresponding to the first mapping shell and diagram 760-2 illustrates mappings corresponding to the second mapping shell. In this example, the MSB (e.g., bit[24]) of the 25 bit data pattern (e.g., represented as bit[24:0]) indicates whether the data pattern maps to the first shell or the second shell. For instance, if bit[24] is "0" (e.g., the binary value of the 25 bit data pattern is less than 16,777,216), the data pattern maps to the first shell, and if bit[24] is "1" (e.g., the binary value of the 25 bit data pattern is greater than or equal to 16,777,216), the data pattern maps to the second shell.

FIG. 7A illustrates how the bits[23:0] of the 25 bit data pattern can be mapped to program state combinations of the eight cells[7:0] systematically for the first mapping shell. For instance, bits [23:21] can be assigned to cell[7], bits[20:18] can be assigned to cell[6], bits[17:15] can be assigned to cell[5], bits[14:12] can be assigned to cell[4], bits[11:09] can be assigned to cell[3], bits[8:6] can be assigned to cell[2], bits[5:3] can be assigned to cell[1], and bits[2:0] can be assigned to cell[0], with the binary values of the bit combinations assigned to the cells corresponding directly to the program states of the respective cells (e.g., with the binary values "000" through "111," corresponding directly to L0 through L7, respectively).

FIG. 7B illustrates how the bits [23:0] of the 25 bit data pattern can be mapped to program state combinations of the eight cells[7:0] for the second mapping shell. As noted above, for program state combinations of the second mapping shell, one of cells[7:0] carries program state L8. In this example, bits[23:21] are used to determine which of cells[7:0] carries program state L8 (e.g., a binary value of "000" for bits[23:21] indicates cell[0] carries L8, a binary value of "001" for bits [23:21] indicates cell[1] carries L8, a binary value of "010" for bits [23:21] indicates cell[2] carries L8, etc.). That is, bits [23:21] are the swap bits for this 3.125 bits/cell example. As such, as shown in FIG. 7B, if bits[23:21] are "000," cell[0] is the swap cell, if bits[23:21] are "001," cell[1] is the swap cell, and if bits[23:21] are "010," cell[2] is the swap cell, etc. FIG. 7B also indicates the bit assignments for the seven cells that do not carry L8. For instance, as illustrated, if bits[23:21] of the 25 bit data pattern are "000" such that cell[0] carries L8, then bits[5:3] are assigned to cell[1], bits[8:6] are assigned to cell[2], bits[11:9] are assigned to cell[3], bits[14:12] are assigned to cell[4], bits[17:15] are assigned to cell[5], bits [20:18] are assigned to cell[6], and bits[2:0] are assigned to cell[7]. In the second mapping shell, the bit combinations [20:18], [17:15], [14:12], [11:09], [8:6], [5:3], and [2:0] of the 25 bit data pattern each correspond directly to the program states L0 to L7. For instance, a 25 bit data pattern of 1000010001000100011101111 having bits[23:21] being "000," bits[20:18] being "010," bits[17:15] being "001," bits [14:12] being "000," bits[11:9] being "100," bits[8:6] being "011," bits[5:3] being "101," and bits[2:0] being "111," maps to cell[0] (e.g., the swap cell) being programmed to program state L8, cell[1] being programmed to program state L5, cell[2] being programmed to program state L3, cell[3] being programmed to program state L4, cell[4] being programmed to program state L0, cell[5] being programmed to program state L1, cell[6] being programmed to program state L2, and cell[7] being programmed to program state L7 in accordance with the second shell mapping illustrated in FIG. 7B.

As such, FIGS. 7A and 7B illustrate a manner in which the different 25 bit data patterns corresponding to a first and a second mapping shell are mapped to respective program state combinations of a group of four memory cells each storing 3.125 bits/cell in accordance with a number of embodiments of the present disclosure.

Mappings such as those described above in connection with FIGS. 4A through 7B can be used, for example, in association with determining the data pattern (e.g., the N bit data pattern) stored in a group of G memory cells, where N is an integer number of bits, G is a quantity of memory cells storing the N bits, and where each memory cell of the group is programmed to one of a quantity of L program states and stores a fractional quantity of the N bits.

For instance, determining the particular N bit data pattern to which the combination of the respective determined program states of the group corresponds (e.g., in association with a read operation) can be based, at least partially, on a mapping constellation comprising a first mapping shell and a second mapping shell, with the first and second mapping shells being defined by a polynomial expression of order G. A data packing component such as component 112 shown in FIG. 1 can be used in association with mapping between program state combinations and data patterns, for instance As illustrated by the example shell mappings shown in FIGS. 4A through 7B, the determined program states of the respective group of memory cells can indicate the particular mapping shell to which the data pattern stored in the group corresponds. For example, one or more program states of the L program states to which the cells are programmable correspond only to a mapping shell other than the first mapping shell. As such, if a determination is made that no cells of the group are programmed to a program state corresponding only to a mapping shell other than the first mapping shell, then the group of cells stores a bit pattern corresponding to the first mapping shell. As described above, the bits of the data pattern can be assigned to the cells of the group in a systematic manner for mappings of the first shell. Alternatively, if a determination is made that a cell of the group is programmed to a program state (e.g., an upper program state) corresponding to a mapping shell other than the first mapping shell, then the group stores a bit pattern corresponding to a mapping shell other than the first mapping shell. As described above, the bits assigned to the cells of the group can depend on which of the cells of the group is programmed to the program state not corresponding to the first mapping shell (e.g., the swap cell).

In a number of embodiments, a controller (e.g., controller 108) can determine the bit pattern stored in the group (e.g., in association with a read operation), and can provide the data to a host (e.g., host 102). The bit pattern stored in the group of cells can be decoded (e.g., via error code/decode component 114) prior to being provided to the host (e.g., if previously encoded with error data).

Conclusion

The present disclosure includes methods and apparatuses for mapping between program states and data patterns. One method includes: programming a group of G memory cells such that a combination of respective program states of the group maps to a constellation point corresponding to a received N unit data pattern, the group used to store N/G units of data per memory cell; wherein the constellation point is one of a number of constellation points of a constellation associated with mapping respective program state combinations of the group of memory cells to N unit data patterns; and wherein the constellation comprises a first mapping shell and a second mapping shell, the constellation points corresponding to the respective first and second mapping shells determined, at least partially, based on a polynomial expression of order equal to G.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of a number of the associated listed items.

As used herein, the term "and/or" includes any and all combinations of a number of the associated listed items. As used herein the term "or," unless otherwise noted, means logically inclusive or. That is, "A or B" can include (only A), (only B), or (both A and B). In other words, "A or B" can mean "A and/or B" or "a number of A and B."

It will be understood that, although the terms first, second, third, etc. may be used herein to describe various elements, these elements should not be limited by these terms. These terms are only used to distinguish one element from another element. Thus, a first element could be termed a second element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:
1. An apparatus, comprising:
   a plurality (G) of memory cells each programmable to one of a plurality (L) of program states; and a packing component configured to:
map each one of a plurality ($2^N$) of data patterns to a respective one of $2^N$ program state combinations corresponding to the G memory cells in accordance with a mapping constellation comprising at least a first shell of constellation mapping points and a second shell of constellation mapping points, wherein the G memory cells are configured to store N/G units of data per memory cell.

2. The apparatus of claim 1, wherein the first shell of constellation mapping points comprises constellation mapping points corresponding to program state combinations comprising only a first quantity (A) of the L program states and the second shell of constellation mapping points comprises constellation mapping points corresponding only to program state combinations comprising at least one of the L program states other than the A program states.

3. The apparatus of claim 1, wherein:
a quantity of constellation mapping points corresponding to the first shell is determined based on a first term of a polynomial expression $(A+B)^G$ such that $A^G$ is the quantity of constellation mapping points of the first shell; and
a quantity of constellation mapping points corresponding to the second shell is determined based on a second term of the polynomial expression such that $G \times A^{(G-1)} \times B$ is the quantity of constellation points of the second mapping shell, with B being a quantity of program states equal to L–A.

4. The apparatus of claim 1, wherein the first mapping shell comprises constellation mapping points corresponding only to program state combinations that do not include at least one of the L program states to which the G memory cells are programmable, L being a minimum number of program states needed to store N/G units of data per memory cell of the G memory cells.

5. The apparatus of claim 4, wherein the at least one of the L program states corresponds to a program state having an uppermost threshold voltage (Vt) associated therewith.

6. The apparatus of claim 4, wherein the second mapping shell comprises a number of constellation mapping points corresponding to program state combinations that include the at least one of the L program states.

7. The apparatus of claim 4, wherein N/G is a fractional number.

8. The apparatus of claim 1, wherein the apparatus is a controller.

9. A method, comprising:
providing a mapping constellation comprising at least a first shell of constellation mapping points and a second shell of constellation mapping points;
wherein quantities of constellation points corresponding to the respective first and second shells are determined, at least partially, based on a polynomial expression of order equal to G;
wherein G is a plurality of memory cells each programmable to one of a plurality (L) of program states; and
mapping between a plurality ($2^N$) of data patterns and respective ones of $2^N$ program state combinations corresponding to the G memory cells in accordance with the mapping constellation, wherein the G memory cells are configured to store N/G units of data per memory cell.

10. The method of claim 9, wherein the polynomial expression is $(A+B)^G$ with $A^G$ being a quantity of constellation points of the first shell and $G \times A^{(G-1)} \times B$ being a quantity of constellation points of the second shell.

11. The method of claim 10, wherein A is a quantity of program states from which the respective program state combinations corresponding to the first shell are determined and B is a quantity of additional program states from which the respective program state combinations corresponding to the second shell are determined.

12. The method of claim 10, wherein the method includes receiving a number of N bit data patterns, wherein those N bit data patterns corresponding to binary values less than the binary value of $A^G$ are mapped to program state combinations corresponding to the first shell, and wherein those N bit data patterns corresponding to binary values greater than or equal to the binary value of $A^G$ are mapped to program state combinations corresponding to the second shell.

13. The method of claim 10, wherein each of the $A^G$ constellation points of the first shell corresponds to a different N unit data pattern of the $2^N$ data patterns.

14. The method of claim 9, wherein the method includes determining whether a constellation point corresponding to a particular received N unit data pattern is within the first mapping shell or the second shell mapping shell based on a value of a most significant bit (MSB) of the particular data pattern.

15. An apparatus, comprising:
an array of memory cells each programmable to a plurality (L) of program states; and
a controller coupled to the array to:
determine a particular N unit data pattern stored in a plurality (G) of memory cells each programmed to a respective one of the L program states;
wherein the particular N unit data pattern is determined based on a mapping between $2^N$ program state combinations and a respective $2^N$ N unit data patterns;
wherein the mapping is based, at least partially, on a polynomial expression of order equal to G, a first term of the polynomial expression corresponding to a first mapping shell and a second term of the polynomial expression corresponding to a second mapping shell.

16. The apparatus of claim 15, wherein:
the first term of the polynomial expression is $A^G$, with $A^G$ being a quantity of constellation points of the first mapping shell, and wherein A is a quantity of the L program states corresponding to the $A^G$ constellation points of the first mapping shell; and
the second term of the polynomial expression is $G \times A^{(G-1)} \times B$, with $G \times A^{(G-1)} \times B$ being a quantity of constellation points of the second mapping shell, and wherein B is an additional quantity of the L program states corresponding to the $G \times A^{(G-1)} \times B$ constellation points of the second mapping shell.

17. The apparatus of claim 15, wherein the mapping indicates a swap cell for constellation points of the second mapping shell.

18. The apparatus of claim 15, wherein the N unit data patterns are N bit data patterns, and wherein each of the mappings of the first mapping shell correspond to an N bit data pattern having a most significant bit with a particular binary value, and each of the mappings of the second mapping shell correspond to an N bit data pattern having a most significant bit with a different particular binary value.

19. The apparatus of claim 15, wherein the controller is configured to determine the N unit data pattern stored in the G memory cells without performing a code expansion on the data.

20. The apparatus of claim 15, wherein the G memory cells are fractional unit memory cells.

* * * * *